United States Patent

Cheng et al.

(10) Patent No.: US 9,871,112 B1
(45) Date of Patent: Jan. 16, 2018

(54) SEMICONDUCTOR DEVICE AND METHOD OF MANUFACTURING THE SAME

(71) Applicant: National Taiwan Normal University, Taipei (TW)

(72) Inventors: Chun-Hu Cheng, Tainan (TW); Chun-Yen Chang, Hsinchu County (TW); Yu-Chien Chiu, Kaohsiung (TW)

(73) Assignee: National Taiwan Normal University, Taipei (TW)

( * ) Notice: Subject to any disclaimer, the term of this patent is extended or adjusted under 35 U.S.C. 154(b) by 0 days.

(21) Appl. No.: 15/464,319

(22) Filed: Mar. 20, 2017

(30) Foreign Application Priority Data

Jan. 9, 2017 (TW) .............................. 106100636 A

(51) Int. Cl.
H01L 29/51 (2006.01)
H01L 29/778 (2006.01)
H01L 29/66 (2006.01)
H01L 29/10 (2006.01)
H01L 21/28 (2006.01)

(52) U.S. Cl.
CPC ...... H01L 29/516 (2013.01); H01L 21/28291 (2013.01); H01L 29/1054 (2013.01); H01L 29/66462 (2013.01); H01L 29/7787 (2013.01)

(58) Field of Classification Search
CPC .............. H01L 29/516; H01L 29/1054; H01L 29/66462; H01L 29/7787
See application file for complete search history.

(56) References Cited

U.S. PATENT DOCUMENTS

| 7,728,356 | B2 | 6/2010 | Suh et al. | |
| 8,587,031 | B2 | 11/2013 | Lu et al. | |
| 9,318,593 | B2 | 4/2016 | Wu et al. | |
| 2010/0258841 | A1* | 10/2010 | Lidow | H01L 29/1066 257/192 |
| 2011/0114967 | A1* | 5/2011 | Hikita | H01L 29/1066 257/76 |
| 2012/0061729 | A1* | 3/2012 | Shibata | H01L 29/66462 257/194 |

(Continued)

FOREIGN PATENT DOCUMENTS

TW 201301400 A1 1/2013

OTHER PUBLICATIONS

C. H. Cheng et al., "Low-Leakage-Current DRAM-Like Memory Using a One-Transistor Ferroelectric MOSFET With a HF-Based Gate Dielectric," IEEE Electron Device Letters, vol. 35, No. 1, pp. 138-140, Jan. 2014.

(Continued)

*Primary Examiner* — Peniel M Gumedzoe
(74) *Attorney, Agent, or Firm* — CKC & Partners Co., Ltd.

(57) ABSTRACT

A semiconductor device includes a substrate, a channel layer, a barrier layer, a source and a drain, a p-type nitride layer and a strain gate. The channel layer is disposed on the substrate. The barrier layer is disposed on the channel layer. The source and the drain are respectively disposed at two sides of the barrier layer. The p-type nitride layer is disposed on the barrier layer. The strain gate is disposed over the p-type nitride layer for tuning a first strain of the channel layer and a second strain of the barrier layer.

6 Claims, 8 Drawing Sheets

(56) References Cited

U.S. PATENT DOCUMENTS

2012/0313106 A1\* 12/2012 He .................. H01L 29/1066
                                                      257/76
2014/0205181 A1    7/2014 Woodfill et al.
2016/0233328 A1\*  8/2016 Cheng ............... H01L 29/511

OTHER PUBLICATIONS

Giuseppe Greco et al., "Effects of Annealing Treatments on the Properties of Al/Ti/p-GaN Interfaces for Normally OFF p-GaN HEMTs," IEEE Transactions on Electron Devices, vol. 63, No. 7, pp. 2735-2741, Jul. 2016.

\* cited by examiner

SEMICONDUCTOR DEVICE AND METHOD OF MANUFACTURING THE SAME

RELATED APPLICATIONS

This application claims priority to Taiwan Application Serial Number 106100636, filed Jan. 9, 2017, which is herein incorporated by reference.

BACKGROUND

Field of Invention

The present invention relates to a semiconductor device and a method of manufacturing the same. More particularly, the present invention relates to a high electron mobility transistor.

Description of Related Art

In semiconductor technologies, III-V compound semiconductors can be used to form a variety of integrated circuit devices, such as a high power field effect transistor, a high frequency transistor, or a high electron mobility transistor (HEMT). The III-V compound semiconductors have the potential to replace the semiconductor materials of the traditional silicon transistors.

However, when the III-V compound semiconductor is gallium nitride or gallium oxide, the channel is in the normally-on state. Since the threshold voltage of a normally-on transistor is a negative value, current in the transistor is still in the conducting state when the transistor is at zero gate bias and it causes an extra power loss. Currently, methods to solve this problem, such as thinning of the gallium nitride layer, ion implantation, or the use of p-type gallium oxide, make the threshold voltage higher than 0V. When a p-type nitride layer is used as a gate, although the threshold voltage can be adjusted to a positive value so as to form a normally-off device, the gate that is the p-type nitride layer will mismatch with the lattices of the barrier layer underneath. Hence, the device tends to generate a large gate leakage current, on-resistance ($R_{ON}$), off current, and a low current on/off ratio, etc. These problems will limit the applications of gallium nitride devices in the high-voltage or high-frequency fields.

SUMMARY

According to various embodiments of the present application, a semiconductor device is provided. The semiconductor device includes a substrate, a channel layer, a barrier layer, a source and a drain, a p-type nitride layer, and a strain gate. The channel layer is disposed on the substrate. The barrier layer is disposed on the channel layer. The source and the drain are respectively disposed at two sides of the barrier layer. The p-type nitride layer is disposed on the barrier layer. The strain gate is disposed over the p-type nitride layer. The strain gate is configured to tune a first strain of the channel layer and a second strain of the barrier layer.

In some embodiments, the strain gate includes metal nitride, metal carbide, or an aluminum alloy.

In some embodiments, the semiconductor device further includes a ferroelectric material layer disposed between the p-type nitride layer and the strain gate.

In some embodiments, the substrate includes a base substrate, a crystal seed layer, and a buffer layer. The crystal seed layer is disposed on the base substrate. The buffer layer is disposed on the crystal seed layer.

In some embodiments, the ferroelectric material layer comprises lead zirconate titanate, barium strontium titanate, strontium bismuth tantalate, lead lanthanum zirconate titanate, or doped hafnium oxide.

In some embodiments, the doped hafnium oxide comprises a dopant. The dopant includes Zr, Al, Si, Y, Gd, Sr or La. A concentration of Zr dopant ranges between 20% and 75%, a concentration of Al dopant ranges between 1% and 20%, a concentration of Si dopant ranges between 1% and 10%, a concentration of Y dopant ranges between 1% and 20%, a concentration of Gd dopant ranges between 1% and 10%, a concentration of Sr dopant ranges between 1% and 10%, and a concentration of La dopant ranges between 1% and 10%.

In some embodiments, a crystal system of the ferroelectric material layer belongs to the orthorhombic system.

According to various embodiments of the present application, the invention provides a method of manufacturing a semiconductor device. The method includes: providing a substrate; forming a channel layer on the substrate; forming a barrier layer on the channel layer; forming a source and a drain at two sides of the barrier layer respectively; forming a p-type nitride layer on the barrier layer; and forming a strain gate over the p-type nitride layer.

In some embodiments, forming the strain gate includes providing at least one metal gas, argon, and nitrogen to form a metal nitride layer, wherein a ratio of the argon to the nitrogen is between 100:5 and 100:15.

In some embodiments, the strain gate exerts a stress to a ferroelectric material layer after forming the strain gate on the ferroelectric material layer, and the stress ranges between 17.3 and 24.95 GPa.

In some embodiments, the method further includes forming a ferroelectric material layer on the p-type nitride layer after forming the p-type nitride layer on the barrier layer, wherein the ferroelectric material layer is disposed between the p-type nitride layer and the strain gate.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor device and a method of manufacturing the semiconductor device are provided hereinafter. The structure and the characteristics of the semiconductor device and the preparation steps or operations of the semiconductor device are described in detail.

In recent years, high electron mobility transistors (HEMTs) have been widely applied to high-power circuit systems due to the excellent characteristics, such as a high output power, a high breakdown voltage, and an excellent resistance to high temperatures. Since a large number of polarized charges exist between the channel layer and the barrier layer in the structure of the high electron mobility transistor known in the art, these polarized charges form a two dimensional electron gas (2DEG) to allow electrons to have a high mobility. Under the circumstances, current in the transistor is still in the conducting state when no gate bias is applied to the transistor. The transistor is therefore called a normally-on transistor. The threshold voltage of the normally-on transistor is a negative value. That is, current is still in the conducting state when the transistor is at zero gate bias and thereby causes an extra power loss. Hence, the present invention provides a high electron mobility transistor device having a strain gate that can reduce the subthreshold slope, the gate leakage current, and the on-resistance ($R_{ON}$) so as to increase the drive current and the current on/off ratio.

Figure 1:
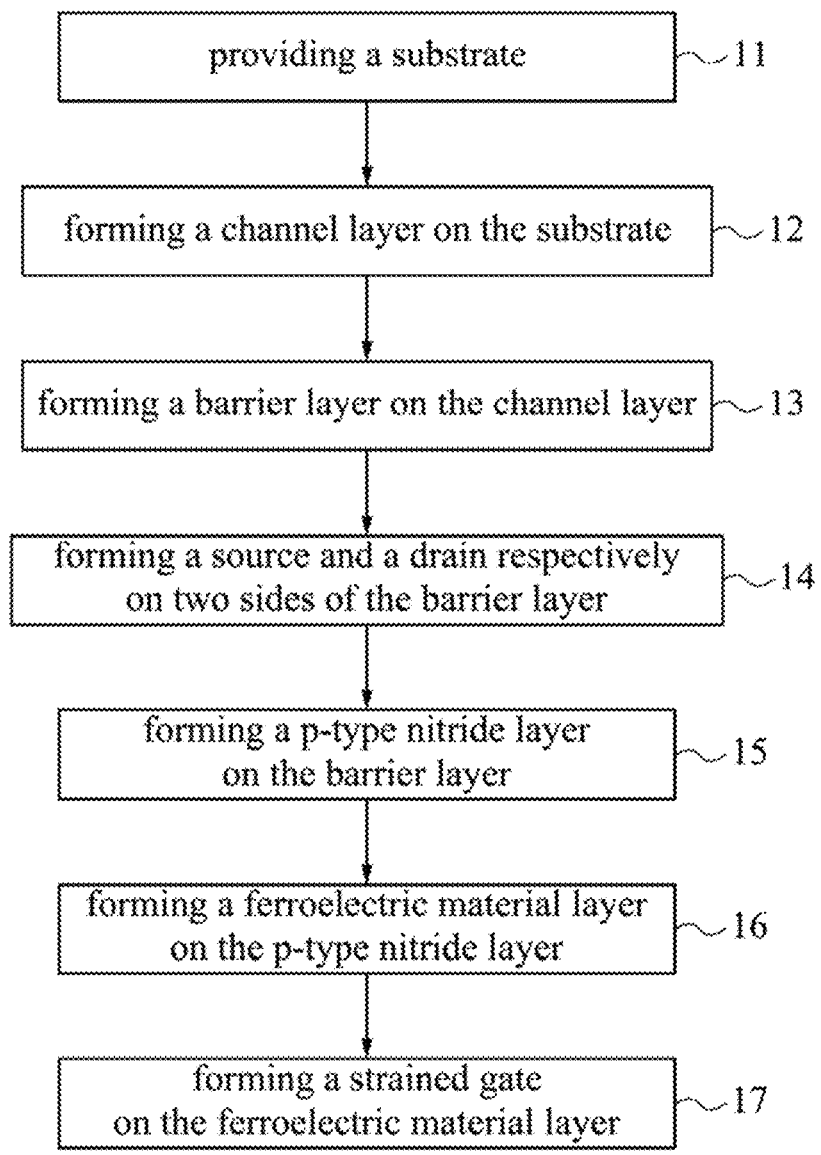
FIG. 1 is a flowchart illustrating a method of manufacturing a semiconductor device according to some embodiments of this invention.

FIG. 1 is a flowchart illustrating a method of manufacturing a semiconductor device according to some embodiments of this invention. As shown in FIG. 1, a method 10 includes a step 11, a step 12, a step 13, a step 14, a step 15, a step 16, and a step 17. It is understood that additional steps may be provided before, during, or after the method 10, and some of the operations described below may be substituted or cancelled to serve as additional embodiments of the method.

Figure 2:
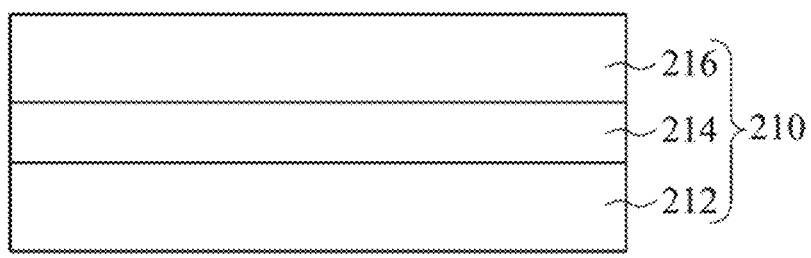
FIG. 2, FIG. 3, FIG. 4, FIG. 5, FIG. 6, FIG. 7, FIG. 8A and FIG. 8B are cross-sectional views illustrating various stages of the method of manufacturing a semiconductor device according to various embodiments of this invention.

In step 11, a substrate is provided. In some embodiments, as shown in FIG. 2, a substrate 210 includes a base substrate 212, a crystal seed layer 214, and a buffer layer 216. The crystal seed layer 214 is disposed on the base substrate 212, and the buffer layer 216 is disposed on the crystal seed layer 214. In some embodiments, the substrate 210 only includes the base substrate 212. In examples, the base substrate 212 is a silicon (Si) substrate, a silicon carbide (SiC) substrate, a sapphire substrate, a gallium nitride (GaN) substrate, an aluminum gallium nitride (AlGaN) substrate, an aluminum nitride (AlN) substrate, a gallium phosphide (GaP) substrate, a gallium arsenide (GaAs) substrate, an aluminum gallium arsenide (AlGaAs) substrate, or other substrates including III-V compounds. In some embodiments, the crystal seed layer 214 is helpful in compensating mismatch between the base substrate and the buffer layer. In examples, the crystal seed layer 214 includes a single-layered structure or a multi-layered structure. In examples, the crystal seed layer includes the same material formed at different temperatures. For example, the crystal seed layer 214 may include two layers of AlN, and an upper AlN layer is formed at a higher temperature, as compared to a lower AlN layer. The buffer layer 216 is helpful in decreasing lattice mismatch between the crystal seed layer 214 and a channel layer subsequently formed, and resolving the problem that the thickness of an epitaxial channel layer over the base substrate 212 is impacted due to the mismatch between the thermal expansion coefficients of the epitaxial channel layer and the base substrate 212 during the epitaxial growth. In some embodiments, the buffer layer 216 includes a layer of GaN or GaN having p-type dopants. The buffer layer 216 is formed by using an epitaxial process or some other suitable methods. In one embodiment, the p-type dopant includes carbon, iron, magnesium, zinc, or other suitable p-type dopants.

Figure 3:
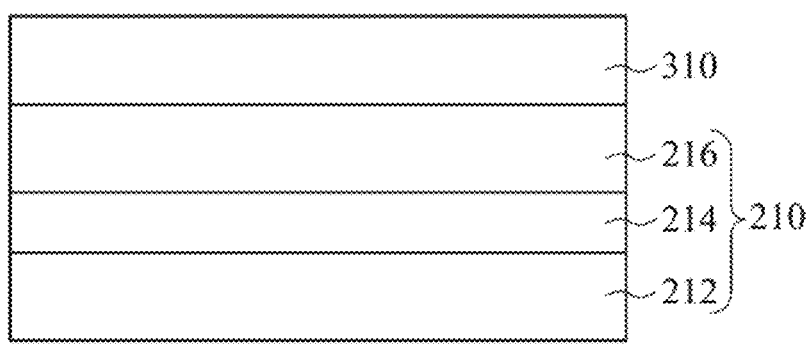

In step 12, a channel layer is formed on the substrate. FIG. 3 illustrates a cross-sectional view of forming a channel layer 310 on the substrate 210 according to some embodiments of this invention. In some embodiments, the channel layer 310 may be a layer made of AlGaN, GaN, indium gallium nitride (InGaN), aluminum indium gallium nitride (AlInGaN), III-V compounds, or doped III-V compounds.

Figure 4:
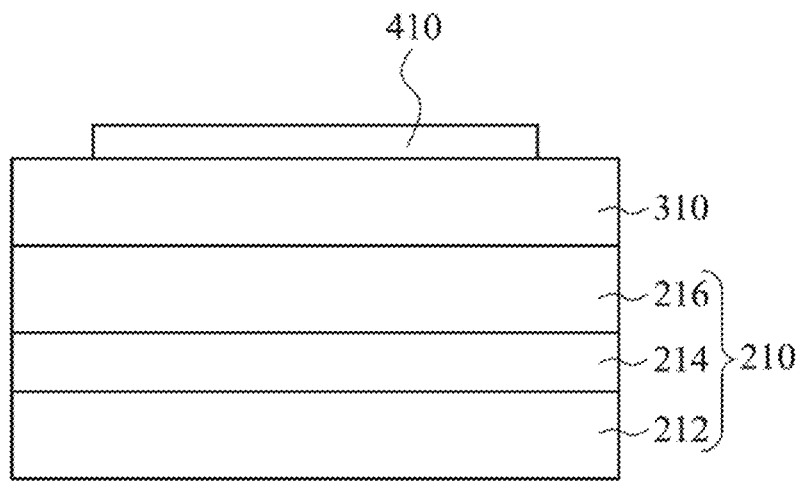

In step 13, a barrier layer is formed on the channel layer. FIG. 4 illustrates a cross-sectional view of forming a barrier layer 410 on the channel layer 310 according to some embodiments of this invention. In some embodiments, the barrier layer 410 includes a layer of AlN, aluminum indium nitride (AlInN), AlGaN, GaN, InGaN, AlInGaN, or III-V compounds. A band gap of the channel layer 310 is less than a band gap of the barrier layer 140. The combinations of the channel layer 310 and the barrier layer 410 and the thicknesses of the channel layer 310 and the barrier layer 410 need to be able to generate a two dimensional electron gas. In one example, each of the channel layer 310 and the barrier layer 410 may be a multi-layered structure. In another embodiment, some other layers may be further formed. For example, an intermediate layer (not shown) can be formed between the channel layer 310 and the barrier layer 410. A doped layer (not shown) can be formed on the barrier layer 410 to increase electrons of the two dimensional electron gas. A capping layer (not shown) can be formed on the barrier layer 410 to prevent the barrier layer 410 from oxidizing.

Figure 5:
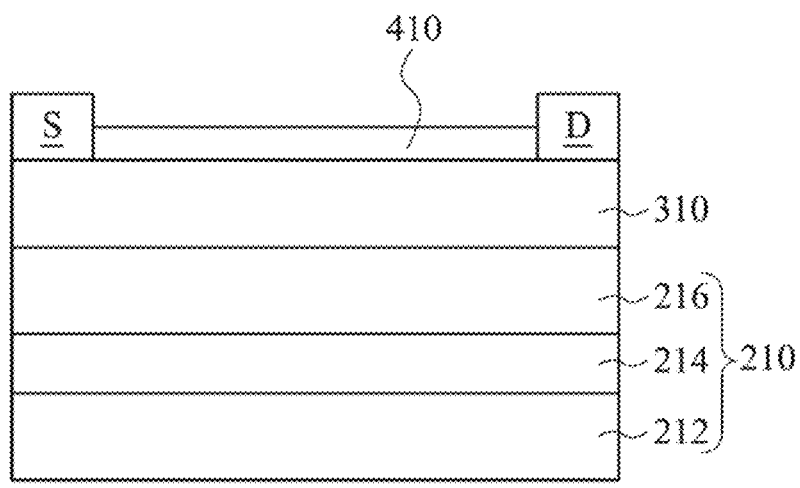

In step 14, a source and a drain are respectively formed on two sides of the barrier layer. FIG. 5 illustrates a cross-sectional view of forming a source S and drain D on two sides of the barrier layer 410 according to some embodiments of this invention. In examples, the component of each of the source S and the drain D is selected from the group consisting of silver (Ag), copper (Cu), tungsten (W), titanium (Ti), tantalum (Ta), aluminum (Al), nickel (Ni), ruthenium (Ru), palladium (Pd), platinum (Pt), manganese (Mn), tungsten nitride (WN), titanium nitride (TIN), tantalum nitride (TaN), aluminum nitride (AlN), tungsten silicide (WSi), molybdenum nitride (MoN), nickel silicide ($Ni_2Si$), titanium silicide ($TiSi_2$), titanium aluminide (TiAl), arsenic-doped (As-doped) polycrystalline silicon, zirconium nitride (ZrN), tantalum carbide (TaC), TaCN, TaSiN, titanium aluminium nitride (TiAlN), silicide, and any combination thereof. The source S and drain D may be formed by using any prior art process.

Figure 6:
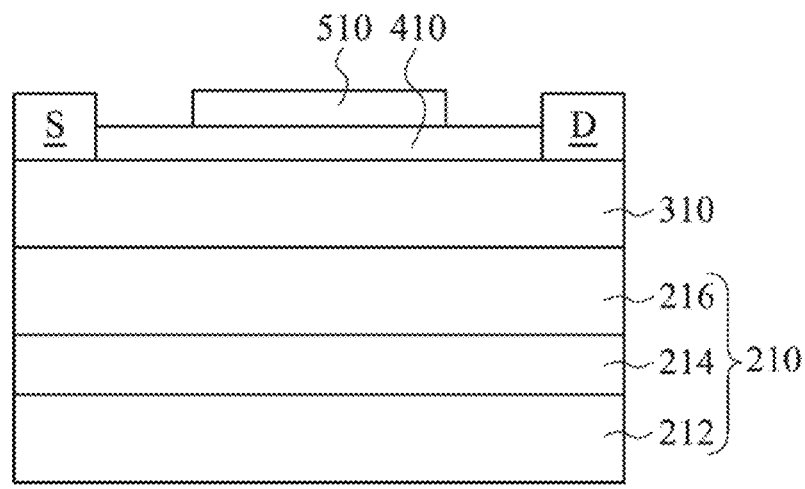

In step 15, a p-type nitride layer is formed on the barrier layer. FIG. 6 illustrates a cross-sectional view of forming a p-type nitride layer 510 on the barrier layer 410 according to some embodiments of this invention. In examples, the p-type nitride layer 510 includes a p-type gallium nitride (p-GaN) layer, a p-type aluminum gallium nitride (p-AlGaN) layer, a p-type III-nitride layer, or other suitable p-type metal nitride layers. When the p-type nitride layer 510 is formed, the barrier layer 410 and the channel layer 310 underneath the p-type nitride layer 510 generate strains because of the lattice mismatch. In this manner, a two dimensional electron gas channel is attenuated so that a threshold voltage is tuned to a positive value to form a normally-off device. In some embodiments, p-type nitride layer 510 may be formed by an epitaxial growth process, such as a molecular beam epitaxial (MBE) process, a metal-organic chemical vapor deposition (MOCVD) process, and/or other suitable epitaxial growth processes.

Figure 7:
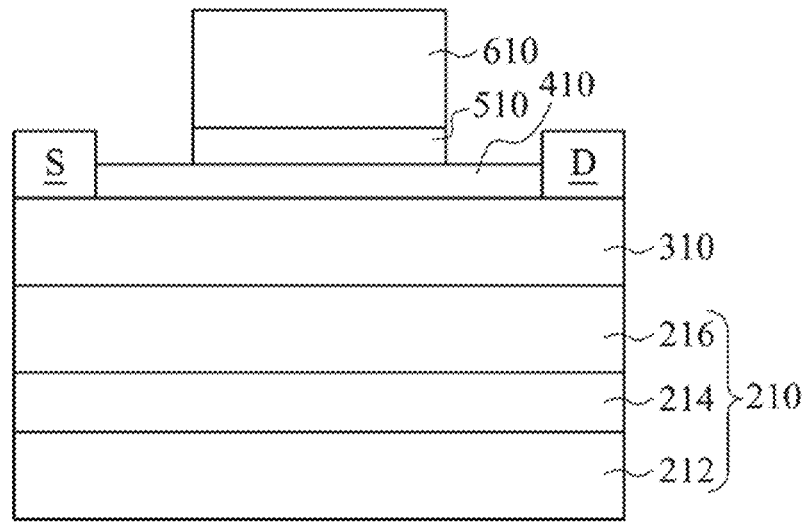

In step 16, a ferroelectric material layer is formed on the p-type nitride layer. FIG. 7 illustrates a cross-sectional view of forming a ferroelectric material layer 610 on the p-type nitride layer 510 according to some embodiments of this invention. The ferroelectric material layer 610 has a negative capacitance. A transistor using a ferroelectric material having a negative capacitance can reduce the subthreshold swing (SS). The subthreshold swing represents the ease of controlling the on-off current of a transistor, and is also the index that determines the on/off transition speed of the transistor so that the transistor can be turned on with a smaller bias voltage. Hence, as compared with the traditional transistor, the transistor with a lower subthreshold swing has a faster on/off transition speed. In examples, the ferroelectric material layer 610 includes a layer made of lead zirconate titanate, barium strontium titanate, strontium bismuth tantalate, lead lanthanum zirconate titanate, or doped hafnium oxides. For example, a dopant of the doped hafnium oxides includes Zr, Al, Si, Y, Gd, Sr or La. The concentration of Zr dopant ranges between 20% and 75%, such as 30%, 40%, 50%, 60% or 70%, preferably 30-70%. The concentration of Al dopant ranges between 1% and 20%, such as 3%, 5%, 7%, 10% or 15%, preferably 2-12%. The concentration of Si dopant ranges between 1% and 10%, such as 3%, 5%, 7%, or 9%, preferably 2-5%. The concentration of Y dopant ranges between 1% and 20%, such as 3%, 7%, 10%, 13%, or 17%, preferably 2-12%. The concentration of Gd dopant ranges between 1% and 10%, such as 3%, 5%, or 8%, preferably 2-6%. The concentration of Sr dopant ranges between 1% and 10%, such as 3%, 5%, or 8%, preferably 2-6%. The concentration of La dopant ranges between 1% and 10%, such as 3%, 5%, or 8%, preferably 3-6%. Doped hafnium oxides out of these ranges of the dopant concentrations do not have the ferroelectric effect, and the doped hafnium oxides within the preferred ranges of dopant content have the strong ferroelectric effect. In some embodiments, the crystal structure that forms the ferroelectric material layer 610 belongs to the orthorhombic system. In some embodiments, the ferroelectric material layer 610 may be formed by plasma enhanced atomic layer deposition, metal-organic chemical vapor deposition (MOCVD), chemical vapor deposition, physical vapor deposition, sputtering, or pulsed laser evaporation. Only when the crystal structures of the hafnium oxides or the doped hafnium oxides belong to the orthorhombic system, the hafnium oxides or the doped hafnium oxides can have the ferroelectric effect. The ferroelectric effect refers to that electric dipoles will align with the direction of an electric field when an external electric field is applied, and the remnant polarization (Pr) in the polarization direction is still retained after the removal of the electric field.

Figure 8A:
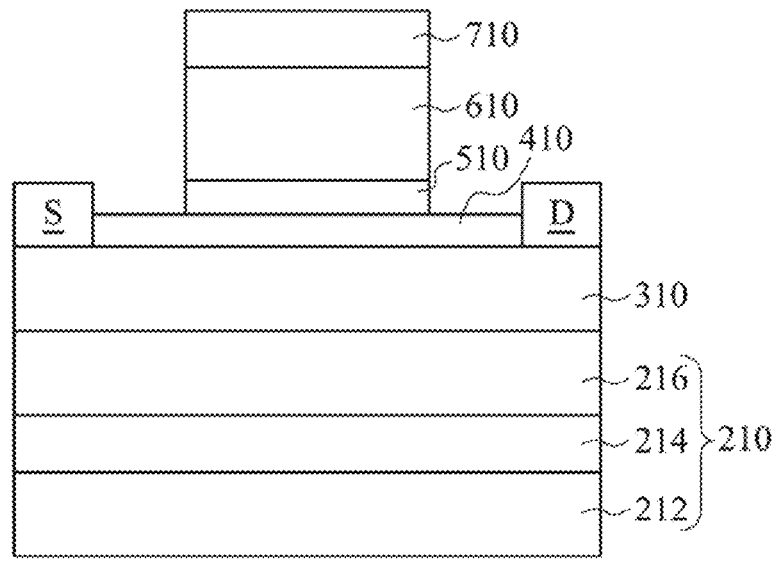

In step 17, a strain gate is formed on the ferroelectric material layer. FIG. 8A illustrates a cross-sectional view of forming a strain gate 710 on the ferroelectric material layer 610 according to some embodiments of this invention. In various embodiments, the strain gate 710 is configured to tune the strain of the channel layer 310 and the strain of the barrier layer 410 so as to tune the threshold voltage value to move towards a positive value and decrease native interface defects caused by the formation of the p-type nitride layer 510. In some examples, the strain gate 710 includes a gate made of metal nitride, such as TiN, titanium carbide (TIC), titanium aluminum carbide (TiAlC), TaN, TaCN, WN, or titanium tungsten nitride (TiWN). In some examples, the strain gate includes a gate made of metal carbide, such as TaC, tantalum aluminum carbide (TaAlC), or niobium aluminum carbide (NbAlC). In other examples, the strain gate includes a gate made of an aluminum alloy, such as titanium TiAl or tantalum aluminide (TaAl). In some embodiments, the strain gate may be formed by plasma enhanced atomic layer deposition, metal-organic chemical vapor deposition, chemical vapor deposition, physical vapor deposition, sputtering, or pulsed laser evaporation. In one example, during the process of forming the metal nitride, the gases provided include at least one kind of metal gas, argon, and nitrogen to form the metal nitride on the ferroelectric material layer 610. A ratio of argon to nitrogen is between 100:5 and 100:15, such as 100:7, 100:10, or 100:12. In another example, during the process of forming the metal carbide, the gases provided include at least one kind of metal gas, argon, and a hydrocarbon gas to form the metal carbide on the ferroelectric material layer 610. The hydrocarbon gas includes a hydrocarbon compound having two carbon atoms. A ratio of argon to the hydrocarbon gas is between 100:5 and 100:15, such as 100:7, 100:10, or 100:12. When the supply ratio of nitrogen or the hydrocarbon gas is too low, the strains of the underneath ferroelectric material layer 610, the barrier layer 410, and the channel layer 310 caused by the strain gate 710 will be insufficient. When the supply ratio is too high, the conductivity of the strain gate 710 will be reduced. In some embodiments, after the strain gate 710 is formed on the ferroelectric material layer 610, the strain gate 710 will exert a stress to the ferroelectric material layer 610 due to the lattice mismatch. The ferroelectric material layer 610 is thus transformed from the monoclinic system to the orthorhombic system. The stress is between 17.3 and 24.95 GPa. In addition, the strain gate 710 can also tune the strains of the channel layer 310 and the barrier layer 410 so as to tune the threshold voltage and also decrease the native interface defects caused by the formation of the p-type nitride layer 510.

Figure 8B:
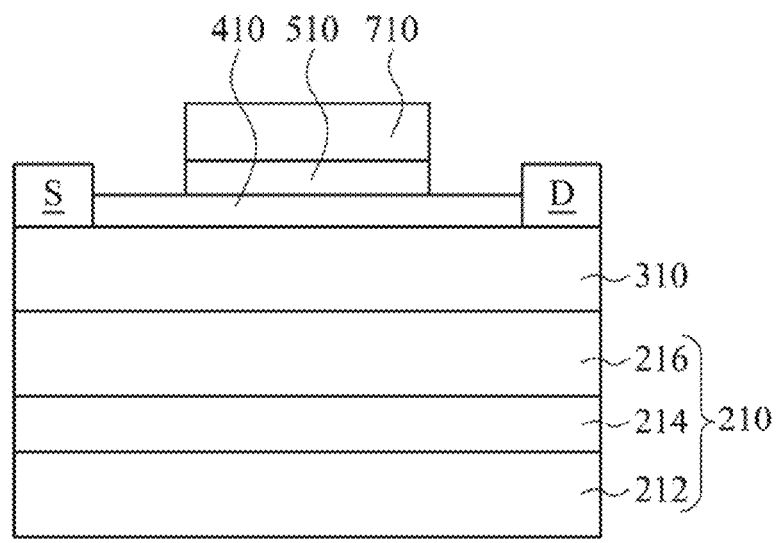

In some embodiments, the strain gate 710 can be directly formed on the p-type nitride layer 510, and the semiconductor device does not include the ferroelectric material layer 610. FIG. 8B illustrates a cross-sectional view of forming the strain gate 710 on the p-type nitride layer 510 according to some embodiments of this invention. In the embodiment illustrated in FIG. 8B, the device includes the substrate 210, the channel layer 310, the barrier layer 410, the source/drain S/D, the p-type nitride layer 510, and the strain gate 710. The channel layer 310 is disposed on the substrate 210. The barrier layer 410 is disposed on the channel layer 310. The source/drain S/D are disposed on the channel layer 310 and on two sides of the barrier layer 410. The p-type nitride layer 510 is disposed on the barrier layer 410. The strain gate 710 is disposed on the p-type nitride layer 510. In examples, the substrate 210 may include the base substrate 212, the crystal seed layer 214, and the buffer layer 216. The strain gate 710 can also tune the strains of the channel layer 310 and the barrier layer 410 so as to tune the threshold voltage and also decrease the native interface defects caused by the formation of the p-type nitride layer 510.

Figure 9A:
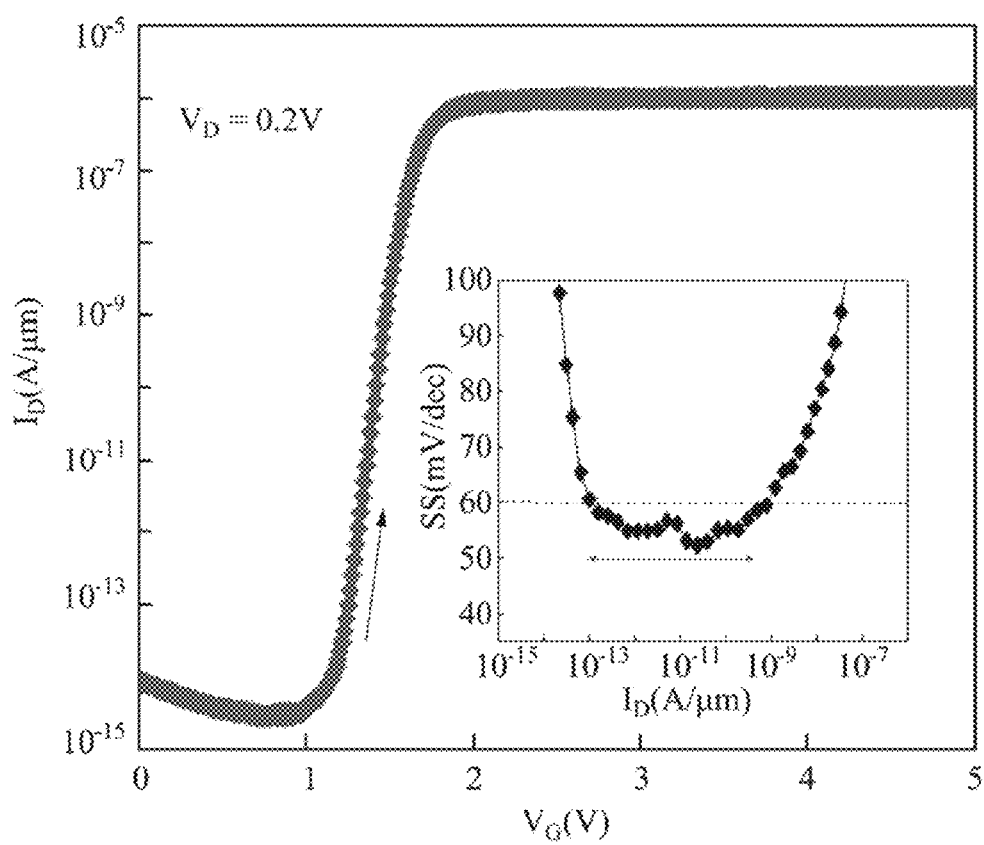
FIG. 9A to FIG. 9E depict the experiment results or a simulation figure of a semiconductor device according to some embodiments of this invention.
Figure 9B:
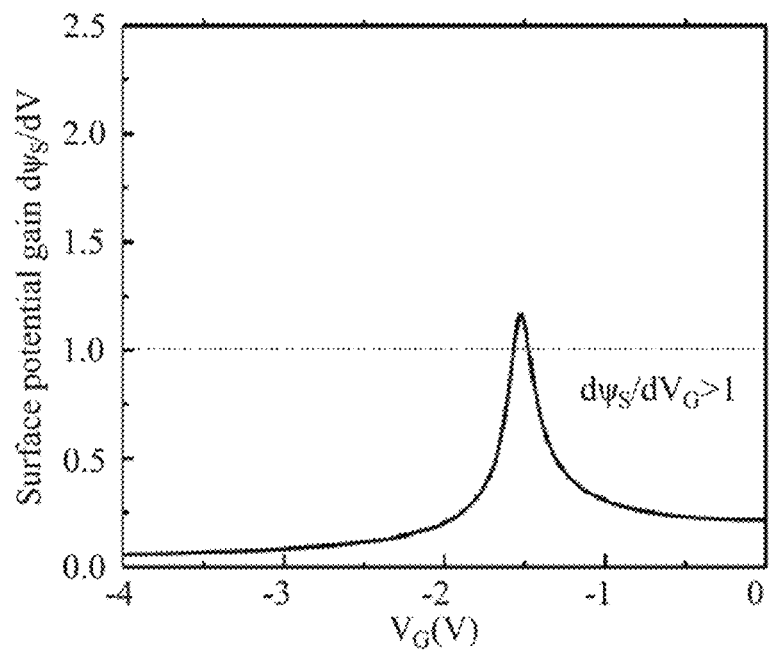

FIG. 9A illustrates an $I_D$-$V_G$ curve of an NMOS device having the ferroelectric material layer 610 according to some embodiments of this invention. In FIG. 9A, the horizontal axis represents the gate voltage $V_G$ (V), and the vertical axis represents the output current $I_D$ (A/μm). It can be seen from the figure that the threshold voltage (Vth) is a positive value so the NMOS device is a normally-off device. The embedded figure shows that the ferroelectric material having a negative capacitance can reduce the subthreshold swing of the device to about 51 mV/decade, which breaks the limitation of the subthreshold swing 60 mV/decade of the traditional transistors. The range of the value of the subthreshold swing lower than 60 mV/decade is 4 decades. FIG. 9B depicts a simulation figure of the $I_D$-$V_G$ curve in FIG. 9A. In FIG. 9B, the surface potential obtained from FIG. 9B is greater than 1, which proves that the transistor has the negative capacitance effect. As a result, the gain current may be enlarged because the surface potential is greater than 1.

Figure 9C:
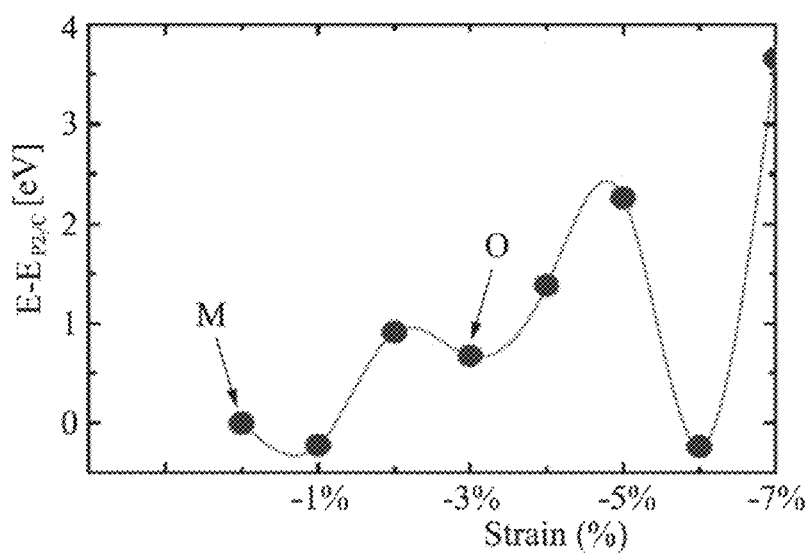

In FIG. 9C, the horizontal axis represents the strain (%), and the vertical axis represents the energy gap (eV). Different crystalline phases have different lattice constants. During a phase transition process of crystals, strains will be generated in the lattice. On the contrary, exerting a stress to the crystals to allow the crystals to generate strains can also accelerate the phase transition. As shown in FIG. 9C, a 3% compressive strain can accelerate the metastable hafnium oxide to transform to the orthorhombic system O from the clinorhombic system M, and the 3% compressive strain of the hafnium oxide corresponding to a stress applied to the crystals ranges from 17.3 Gpa to 24.95 Gpa.

Figure 9D:
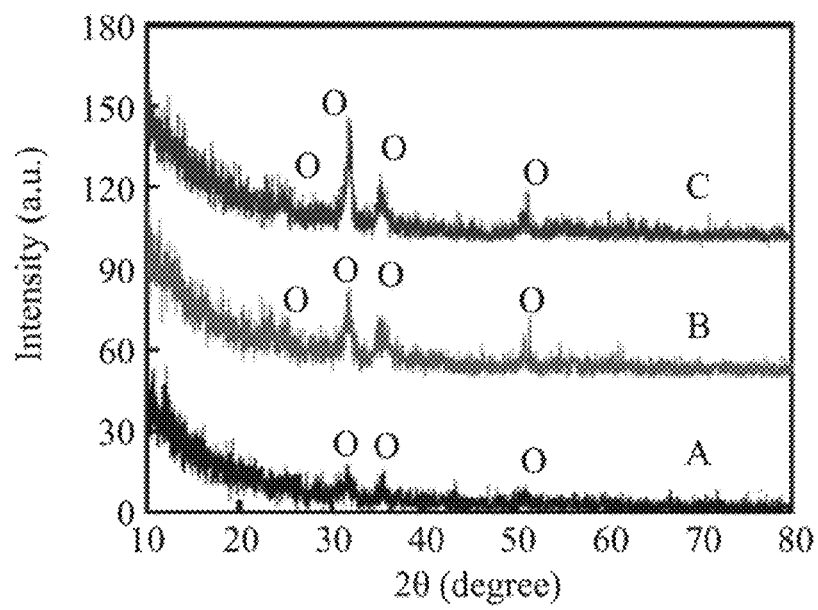

FIG. 9D depicts X-ray powder diffraction patterns of powders of the ferroelectric material layers (zirconium hafnium oxides) according to some embodiments of this invention. Example A represents that the supply ratio of argon to nitrogen is 100:4 during the process of forming the strain gate on the ferroelectric material layer. In Example B, the ratio of argon to nitrogen is 100:7. In Example C, the ratio of argon to nitrogen is 100:10. With the increase of the ratio of nitrogen supplied when the strain gate is formed, the percentage of the zirconium hafnium oxide belonging to the orthorhombic system in the ferroelectric material layer is also increased.

Figure 9E:
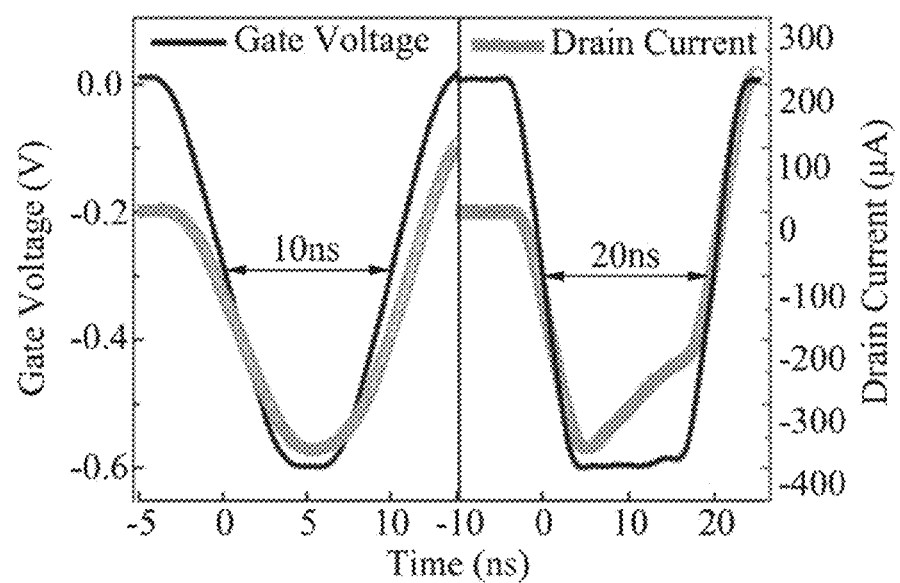

In FIG. 9E, the horizontal axis represents the time (T), and the vertical axes respectively represent the gate voltage and the drain current. In addition, the left side of FIG. 9E represents a transistor having a ferroelectric material, while the right side represents a transistor not having a ferroelectric material. The transistor having the ferroelectric material with the negative capacitance effect has a very fast operation speed, and the fast current response proves that the ferroelectric-antiferroelectric phase transition (FE-AFE phase transition) of the transistor only requires 10 nanoseconds (ns) to complete.

In summary, the embodiments of the present invention provide a semiconductor device that utilizes the strain gate to tune the strains of the barrier layer and the channel layer so as to tune the threshold voltage and decrease the native interface defects caused by the formation of the p-type nitride layer. In some embodiments, the semiconductor device provided herein further includes the ferroelectric material layer. The ferroelectric material layer is disposed between the strain gate and the p-type nitride layer. The ferroelectric material layer having the negative capacitance can reduce the subthreshold slope, the gate leakage current, and the on-resistance ($R_{ON}$) so as to increase the driving current and the current on/off ratio.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device comprising:
   a substrate;
   a channel layer disposed on the substrate;
   a barrier layer disposed on the channel layer;
   a source and a drain respectively disposed at two sides of the barrier layer;
   a p-type nitride layer disposed on the barrier layer;
   a strain gate disposed over the p-type nitride layer, wherein the strain gate is configured to tune a first strain of the channel layer and a second strain of the barrier layer; and
   a ferroelectric material layer disposed between the p-type nitride layer and the strain gate.

2. The semiconductor device of claim 1, wherein the strain gate comprises a metal nitride, a metal carbide, or an aluminum alloy.

3. The semiconductor device of claim 1, wherein the substrate comprises:
   a base substrate;
   a crystal seed layer disposed on the base substrate; and
   a buffer layer disposed on the crystal seed layer.

4. The semiconductor device of claim 1, wherein the ferroelectric material layer comprises lead zirconate titanate, barium strontium titanate, strontium bismuth tantalate, lead lanthanum zirconate titanate, or doped hafnium oxide.

5. The semiconductor device of claim 4, wherein the doped hafnium oxide comprises a dopant, and the dopant comprises Zr, Al, Si, Y, Gd, Sr or La, wherein a concentration of Zr dopant ranges between 20% and 75%, a concentration of Al dopant ranges between 1% and 20%, a concentration of Si dopant ranges between 1% and 10%, a concentration of Y dopant ranges between 1% and 20%, a concentration of Gd dopant ranges between 1% and 10%, a concentration of Sr dopant ranges between 1% and 10%, and a concentration of La dopant ranges between 1% and 10%.

6. The semiconductor device of claim 5, wherein a crystal system of the ferroelectric material layer belongs to the orthorhombic system.

* * * * *